United States Patent
Schier

(10) Patent No.: US 9,334,558 B2
(45) Date of Patent: May 10, 2016

(54) TARGET FOR ARC PROCESSES

(75) Inventor: Veit Schier, Echterdingen (DE)

(73) Assignee: Walter AG, Tübingen (DE)

( * ) Notice: Subject to any disclaimer, the term of this patent is extended or adjusted under 35 U.S.C. 154(b) by 414 days.

(21) Appl. No.: 13/880,514

(22) PCT Filed: Oct. 18, 2011

(86) PCT No.: PCT/EP2011/068189
§ 371 (c)(1),
(2), (4) Date: May 31, 2013

(87) PCT Pub. No.: WO2012/052437
PCT Pub. Date: Apr. 26, 2012

(65) Prior Publication Data
US 2014/0147221 A1     May 29, 2014

(30) Foreign Application Priority Data
Oct. 22, 2010    (DE) .......................... 10 2010 042 828

(51) Int. Cl.
C23C 14/08     (2006.01)
C23C 14/32     (2006.01)
B22F 7/00      (2006.01)

(52) U.S. Cl.
CPC ................. *C23C 14/08* (2013.01); *B22F 7/008* (2013.01); *C23C 14/081* (2013.01); *C23C 14/325* (2013.01); *Y10T 407/27* (2015.01)

(58) Field of Classification Search
USPC ................. 204/298, 192.15, 192.16, 298.13; 51/307, 309; 428/697, 699
See application file for complete search history.

(56) References Cited

U.S. PATENT DOCUMENTS

| | | | |
|---|---|---|---|
| 4,923,764 A | 5/1990 | Hirose et al. | |
| 6,562,207 B1 * | 5/2003 | Ivanov | 204/298.12 |
| 7,311,874 B2 * | 12/2007 | Zhang | 419/32 |
| 7,537,822 B2 * | 5/2009 | Ishikawa | 428/697 |
| 7,638,200 B2 * | 12/2009 | Smathers et al. | 501/97.3 |
| 7,909,949 B2 * | 3/2011 | Nakamura et al. | 204/298.13 |
| 8,936,706 B2 * | 1/2015 | Koide | 204/298.12 |
| 9,034,154 B2 * | 5/2015 | Nakamura et al. | 204/298.13 |
| 2011/0143054 A1 | 6/2011 | Kurapov et al. | |

FOREIGN PATENT DOCUMENTS

| | | |
|---|---|---|
| DE | 37 27 279 | 3/1988 |
| DE | 10 2005 021 927 | 11/2006 |
| EP | 1 722 003 | 3/2006 |
| EP | 1 726 686 | 11/2006 |
| JP | 2006-045587 | * 2/2006 |
| JP | 2008-106287 | * 10/2006 |
| JP | 2008-56957 | 3/2008 |
| JP | 2008-156683 | 7/2008 |
| JP | 2008-163413 | 7/2008 |
| WO | WO 2004/024452 | 3/2004 |
| WO | 2010/020362 | 2/2010 |

OTHER PUBLICATIONS

German Search Report for German Patent Application No. 10 2010 042 828.0, dated Jun. 9, 2011.
International Search Report for PCT/EP2011/068189 dated Dec. 22, 2011.
German Search Report for 10 2010 042 828.0 dated Jun. 9, 2011.
English Translation of the International Preliminary Report on Patentability for PCT/EP2011/068189 dated May 2, 2013.
Decision of Final Rejection (with English Translation) for Japanese Application No. 2013-534296, dated Oct. 6, 2015.

* cited by examiner

*Primary Examiner* — Archene Turner
(74) *Attorney, Agent, or Firm* — Morgan, Lewis & Bockius LLP

(57) ABSTRACT

A target for the deposition of mixed crystal layers with at least two different metals on a substrate by means of arc vapor deposition (arc PVD), wherein the target includes at least two different metals. To produce mixed crystal layers which are as free as possible of macroparticles (droplets) according to the invention at least the metal with the lowest melting point is present in the target in a ceramic compound, namely as a metal oxide, metal carbide, metal nitride, metal carbonitride, metal oxynitride, metal oxycarbide, metal oxycarbonitride, metal boride, metal boronitride, metal borocarbide, metal borocarbonitride, metal borooxynitride, metal borooxocarbide, metal borooxocarbonitride, metal oxoboronitride, metal silicate or mixture thereof, and at least one metal different from the metal with the lowest melting point is present in the target in elemental (metallic) form.

23 Claims, No Drawings

TARGET FOR ARC PROCESSES

SUBJECT-MATTER OF THE INVENTION

The present invention concerns a target for the deposition of mixed crystal layers with at least two different metals on a substrate by means of arc vapor deposition (arc PVD), wherein the target includes at least two different metals. In addition the invention concerns a deposition method using such a target and a cutting tool produced using such a method.

BACKGROUND OF THE INVENTION

When processing materials in particular in metal cutting machining, high demands are made on the corresponding tools. These include wear resistance and depending on the respective purpose of use corresponding hardness, toughness and temperature resistance. To provide those properties tools are generally made from a main body (substrate) of hard metal, cement, steel or hard speed steel with a coating of metallic hard substances, oxide layers or the like with high wear resistance and suitable adhesive and cutting properties. Those coatings be applied using a CVD process (chemical gaseous phase deposition) or a PVD process (physical gaseous phase deposition). In regard to the PVD processes different variants are used for vapor deposition of the material to be deposited. PVD processes with cathode sputtering (sputter deposition), arc vapor deposition (arc PVD), magnetron sputtering, reactive magnetron sputtering and high power impulse magnetron sputtering (HPIMS) are frequently used for coating tools.

An advantage of magnetron sputtering is that vaporisation or sublimation of the target involves fine detachment of particles and that produces a fine coating. A disadvantage of that process however is that the necessary process gas flow is difficult to regulate. In addition in the deposition of aluminum oxide layers in the magnetron sputtering process there is the disadvantage that only relatively small amounts of the particularly preferred wear-resistant alpha phase are deposited.

In contrast thereto in the PVD coating procedure using the arc vapor deposition process (arc PVD) by virtue of high ion energy levels in the deposition of aluminum oxide layers it is possible to achieve a high proportion of the alpha phase in the coating. In that process the arc generates on the target very high temperatures of the order of magnitude of several thousand degrees Celsius which lead to the desired vaporisation or sublimation of the target material for deposition on the substrate. Around the point of impingement of the arc however there are zones of lower temperature for example in the region of 500 to 1000 C in which in the case of some target metals detachment of macroparticles occurs, so-called droplets, which are also deposited on the substrate. Such droplets are responsible for an unwanted roughness of the deposited layer in comparison with layers produced by magnetron sputtering. In addition the droplets cause weakening of the coating as they are generally predominately purely metallic and thus present a low level of hardness and tendency to oxidation.

OBJECT

The object of the present invention was to produce a target for the deposition of mixed crystal layers with at least two different metals on a substrate by means of PVD processes, with which mixed crystal layer which are as free as possible of macroparticles (droplets) are obtained.

DESCRIPTION OF THE INVENTION

According to the invention that object is attained by a target of the kind stated in the opening part of this specification which includes at least two different metals and wherein at least the metal with the lowest melting point is present in the target in a ceramic compound, namely as a metal oxide, metal carbide, metal nitride, metal carbonitride, metal oxynitride, metal oxycarbide, metal oxycarbonitride, metal boride, metal boronitride, metal borocarbide, metal borocarbonitride, metal borooxynitride, metal borooxocarbide, metal borooxocarbonitride, metal oxoboronitride, metal silicate or mixture thereof, and at least one metal different from the metal with the lowest melting point is present in the target in elemental (metallic) form.

In the case of the target according to the invention the metal with the lowest melting point is present in a ceramic compound and therefore has a higher melting point than the pure metal. That reduces or prevents the metal being detached around the colder edge region of the point of impingement of the arc in the form of molten macroparticles or droplets. The problem of droplet formation is markedly reduced or entirely removed in the case of high-melting target materials. The target according to the invention makes it possible to achieve a marked improvement in the coating quality and a considerable reduction in droplet formation.

In an embodiment of the invention the at least two different metals in the target are selected from the group consisting of the elements scandium, yttrium, titanium, zirconium, hafnium, vanadium, niobium, tantalum, chromium, molybdenum, tungsten, manganese, iron, lithium, boron, aluminum, tin and silicon. Preferably the metals in the target are at least aluminum and chromium and particularly preferably the metals in the target are only aluminum and chromium, wherein aluminum is the low-melting metal with a melting point of about 660° C. and chromium is the high-melting metal with a melting point of about 1860° C.

In a further embodiment of the invention the metal with the lowest melting point is present in the target as a binary compound, preferably as metal oxide, metal carbide or metal nitride, particularly preferably metal oxide.

In a further preferred embodiment of the invention the target comprises aluminum oxide ($Al_2O_3$) and metallic chromium (Cr). Alternatively the target comprises aluminum oxide ($Al_2O_3$) and a combination of metallic chromium, (Cr) and a ceramic compound of chromium, in particular chromium nitride (CrN).

The metal with the lowest melting point desirably has a melting point of less than 1500° C., preferably less than 1000° C., particularly preferably less than 700° C. The ceramic compound in which the metal with the lowest melting point is present in the target usually has a melting point which is considerably higher than the melting point of the pure metal, preferably that melting point is at least 1200° C. Frequently the melting point of the ceramic compound in which the metal with the lowest melting point is present in the target is at least 400° C. higher than that of the pure metal.

The melting points specified herein apply under standard conditions, that is to say, at an air pressure of 1.013 bars, and unless otherwise stated relate to the pure metals.

In a preferred embodiment of the invention the metal present in the target in a ceramic compound with the lowest melting point is present in the target in an amount of between 2 and 99 atomic %. With a lower proportion of the metal with the lowest melting point in the target too little of that metal is introduced into the coating to be produced. With an excessively low proportion of the metal droplet formation does not represent a relevant problem even if the metal is present in elemental (metallic) form. Preferably the metal present in the target in a ceramic compound with the lowest melting point is contained in the target in an amount of between 5 and 90 atomic % or between 10 and 80 atomic % or between 20 and 70 atomic % or between 30 and 60 atomic %.

Preferably two metals are contained in the target according to the invention, a low-melting and a high-melting one, particularly preferably aluminum and chromium, wherein aluminum is then present in ceramic form, preferably as aluminum oxide. Alternatively however the higher-melting metal or, if there are a plurality thereof, the higher-melting metals, can also be present in the target, besides the elemental (metallic) form, in a proportion of up to 10 atomic % with respect to the respective metal, in a ceramic compound, namely as a metal oxide, metal carbide, metal nitride, metal carbonitride, metal oxynitride, metal oxycarbide, metal oxycarbonitride, metal boride, metal boronitride, metal borocarbide, metal borocarbonitride, metal borooxynitride, metal borooxocarbide, metal borooxocarbonitride, metal oxoboronitride, metal silicate or mixture thereof. In further embodiments of the invention the higher-melting metals in the target, besides the elemental (metallic) form, are also present in a proportion of up to 20 atomic % or up to 30 atomic % or up to 40 atomic % or up to 50 atomic % or up to 60 atomic % or up to 70 atomic % with respect to the respective metal, in a corresponding ceramic compound.

The target according to the invention can be produced using any method known and suitable for target production, preferably by hot isostatic pressing.

The invention also includes a method of depositing mixed crystal layers with at least two different metals on a substrate by means of arc vapor deposition (arc PVD), wherein at least one target of the kind according to the invention described herein is used.

The invention further concerns a cutting tool comprising a substrate and a single-layer or multi-layer coating applied thereto, wherein at least one layer of the multi-layer coating is a mixed crystal layer produced with the aforementioned method according to the invention.

The substrate of the cutting tool according to the invention for deposition according to the invention of the mixed crystal layers preferably comprises hard metal, cermet, steel or high speed steel (HSS). Particularly preferably the substrate comprises hard metal or cermet.

The cutting tool according to the invention with the applied mixed crystal layer has the advantage that the layer has a particularly high degree of crystallinity and a low proportion of deposited macroparticles (droplets). In the system of the aluminum-chromium mixed oxides, deposited with a target containing aluminum and chromium of the above-described kind, and comparable systems with a similar crystal structure, a particularly high proportion of the thermodymically stable alpha phase of the mixed crystal is obtained when using the method according to the invention. The advantages are a high level of hardness, high wear resistance, high temperature resistance and high thermal shock resistance.

EXAMPLES

Metal oxide layers were deposited on hard metal substrates with a mirror-polished surface by means of reactive arc vapor deposition (arc PVD) at 160 amperes using oxygen as a reactive gas under a pressure of 1.8 Pa and targets according to the invention and comparison targets. The frequency of macroparticles occurring (droplet density) was investigated using a scanning electron microscope. To determine the droplet density, under the scanning electron microscope with a magnification of 4000, the number of droplets of a diameter of at least fpm on an area of 100 μm×100 μm on the deposited thin layers was counted out. Triple determination operations were carried out for each example and comparative example and the mean value was specified.

Example 1

Target: $Al_2O_3$/Cr (Al:Cr=50:50; round source Ø 160 mm)
Deposited layer: aluminum-chromium-oxide
Droplet density: 1 droplet Example 2

Target: $Al_2N$/Cr (Al:Cr=50:50; round source Ø 160 mm)
Deposited layer: aluminum-chromium-oxide
Droplet density: 0.33 droplet Comparative Example 1

Target: Al (round source Ø 160 mm)
Deposited layer: aluminum oxide
Droplet density: 14 droplets Comparative Example 2

Target: Al/Cr (Al:Cr=50:50; round source Ø 160 mm)
Deposited layer: aluminum-chromium-oxide
Droplet density: 9 droplets

The invention claimed is:

1. A target for the deposition of mixed crystal layers with at least two different metals on a substrate by means of arc vapor deposition (arc PVD), wherein the target includes at least two different metals, wherein at least the metal with the lowest melting point is present in the target in a ceramic compound, and wherein at least one metal different from the metal with the lowest melting point is present in the target in elemental (metallic) form.

2. A target according to claim 1, wherein the at least two different metals in the target are selected from the group consisting of the elements scandium, yttrium, titanium, zirconium, hafnium, vanadium, niobium, tantalum, chromium, molybdenum, tungsten, manganese, iron, lithium, boron, aluminum, tin and silicon.

3. A target according to claim 2, wherein the metals in the target are at least aluminum and chromium.

4. A target according to claim 3, wherein the metals in the target are only aluminum and chromium.

5. A target according to claim 2, wherein the ceramic compound is a metal oxide, metal carbide, metal nitride, metal carbonitride, metal oxynitride, metal oxycarbide, metal oxycarbonitride, metal boride, metal boronitride, metal borocarbide, metal borocarbonitride, metal borooxynitride, metal borooxocarbide, metal borooxocarbonitride, metal oxoboronitride, metal silicate or mixture thereof.

6. A target according to claim 1, wherein the metal with the lowest melting point is present in the target as a metal oxide, metal carbide or metal nitride.

7. A target according to claim 1, wherein the metal with the lowest melting point has a melting point of less than 1500° C.

8. A target according to claim 7, wherein the metal with the lowest melting point has a melting point of less than 1000° C.

9. A target according to claim 8, wherein the metal with the lowest melting point has a melting point of less than 700° C.

10. A target according to claim 1, wherein ceramic compound in which the metal with the lowest melting point is present in the target has a melting point of at least 1200° C. and/or a melting point which is at least 400° C. higher than that of the pure metal with the lowest melting point.

11. A target according to claim 1, wherein the metal present in the target in a ceramic compound with the lowest melting point is present in the target in an amount of between 2 and 99 atomic %.

12. A target according to claim 11, wherein the metal present in the target in a ceramic compound with the lowest melting point is present in the target in an amount of between 5 and 90 atomic %.

13. A target according to claim 12, wherein the metal present in the target in a ceramic compound with the lowest melting point is present in the target in an amount of between 10 and 80 atomic %.

14. A target according to claim 13, wherein the metal present in the target in a ceramic compound with the lowest melting point is present in the target in an amount of between 30 and 60 atomic %.

15. A target according to claim 1, wherein the at least one metal different from the metal with the lowest melting point is also present in the target, besides the elemental (metallic) form, in a proportion of up to 10 atomic % with respect to the respective metal, in a ceramic compound.

16. A target according to claim 15, wherein the at least one metal different from the metal with the lowest melting point is also present in the target, besides the elemental (metallic) form, in a proportion of up to 20 atomic % with respect to the respective metal, in a ceramic compound.

17. A target according to claim 16, wherein the at least one metal different from the metal with the lowest melting point is also present in the target, besides the elemental (metallic) form, in a proportion of up to 60 atomic % with respect to the respective metal, in a ceramic compound.

18. A target according to claim 17, wherein the at least one metal different from the metal with the lowest melting point is also present in the target, besides the elemental (metallic) form, in a proportion of up to 70 atomic % with respect to the respective metal, in a ceramic compound.

19. A target according to claim 15, wherein the ceramic compound is a metal oxide, metal carbide, metal nitride, metal carbonitride, metal oxynitride, metal oxycarbide, metal oxycarbonitride, metal boride, metal boronitride, metal borocarbide, metal borocarbonitride, metal borooxynitride, metal borooxocarbide, metal borooxocarbonitride, metal oxoboronitride, metal silicate or mixture thereof.

20. A target according to claim 1 produced by hot isostatic pressing.

21. A method of depositing mixed crystal layers with at least two different metals on a substrate by means of arc vapor deposition (arc PVD), wherein at least one target according to claim 1 is used.

22. A cutting tool comprising a substrate and a single-layer or multi-layer coating applied thereto, wherein at least one layer of the multi-layer coating is a mixed crystal layer produced with the method according to claim 21.

23. A target according to claim 1, wherein the ceramic compound is a metal oxide, metal carbide, metal nitride, metal carbonitride, metal oxynitride, metal oxycarbide, metal oxycarbonitride, metal boride, metal boronitride, metal borocarbide, metal borocarbonitride, metal borooxynitride, metal borooxocarbide, metal borooxocarbonitride, metal oxoboronitride, metal silicate or mixture thereof.

* * * * *